United States Patent
Ye et al.

(10) Patent No.: US 9,093,954 B2
(45) Date of Patent: Jul. 28, 2015

(54) BASK DEMODULATOR AND METHOD FOR DEMODULATING BASK MODULATED SIGNAL

(71) Applicants: Wanfu Ye, Shanghai (CN); Xiang Gao, Shanghai (CN); Dongpeng Hou, Suzhou (CN)

(72) Inventors: Wanfu Ye, Shanghai (CN); Xiang Gao, Shanghai (CN); Dongpeng Hou, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 250 days.

(21) Appl. No.: 13/964,119

(22) Filed: Aug. 12, 2013

(65) Prior Publication Data

US 2014/0253229 A1 Sep. 11, 2014

(30) Foreign Application Priority Data

Mar. 5, 2013 (CN) .......................... 2013 1 0187162

(51) Int. Cl.
*H03D 1/08* (2006.01)
*H03D 1/10* (2006.01)
*H03D 1/18* (2006.01)

(52) U.S. Cl.
CPC . *H03D 1/08* (2013.01); *H03D 1/10* (2013.01); *H03D 1/18* (2013.01)

(58) Field of Classification Search
CPC .......... H04L 27/02; H04L 27/06; H03D 1/08; H03D 1/00
USPC ........... 329/347, 370; 375/316–318, 320, 324
See application file for complete search history.

(56) References Cited

U.S. PATENT DOCUMENTS

| | | | |
|---|---|---|---|
| 3,947,848 A | 3/1976 | Carnahan | |
| 5,553,126 A | 9/1996 | Tang | |
| 5,734,674 A | 3/1998 | Fenton | |
| 6,124,828 A | 9/2000 | Champeau | |
| 6,198,361 B1 * | 3/2001 | Arisawa | 332/115 |
| 6,639,459 B1 * | 10/2003 | Devilbiss | 329/341 |
| 8,010,055 B2 | 8/2011 | Buer | |
| 8,201,056 B2 | 6/2012 | Yue | |
| 2009/0282309 A1 | 11/2009 | Yue | |
| 2010/0007554 A1 | 1/2010 | Wang | |
| 2010/0171369 A1 | 7/2010 | Baarman | |
| 2010/0189196 A1 * | 7/2010 | Wang et al. | 375/320 |
| 2010/0290554 A1 | 11/2010 | Dai | |
| 2011/0065398 A1 | 3/2011 | Liu | |
| 2011/0128178 A1 | 6/2011 | Dafesh | |

* cited by examiner

*Primary Examiner* — Joseph Chang
*Assistant Examiner* — Jeffrey Shin
(74) *Attorney, Agent, or Firm* — Charles Bergere

(57) ABSTRACT

A BASK demodulator includes a signal modifying circuit and a low pass filter (LPF) that couples an amplifier to an output of the modifying circuit. The modifying circuit includes a signal scaling circuit, a rectifying circuit and an AC coupling circuit. A signal shaping circuit couples an output of the amplifier to an output of the demodulator. The signal scaling circuit scales an input BASK modulated signal to provide an unclipped scaled and biased alternating signal that alternates about a bias voltage at a minimum carrier frequency. The rectifying circuit rectifies the unclipped signal to provide a partially rectified signal that is decoupled by the AC coupling circuit to provide a clipped scaled and biased alternating signal. The LPF removes the signal from the clipped scaled and biased alternating signal to provide a demodulated signal, which then is amplified by the amplifier and shaped by the shaping circuit.

20 Claims, 13 Drawing Sheets

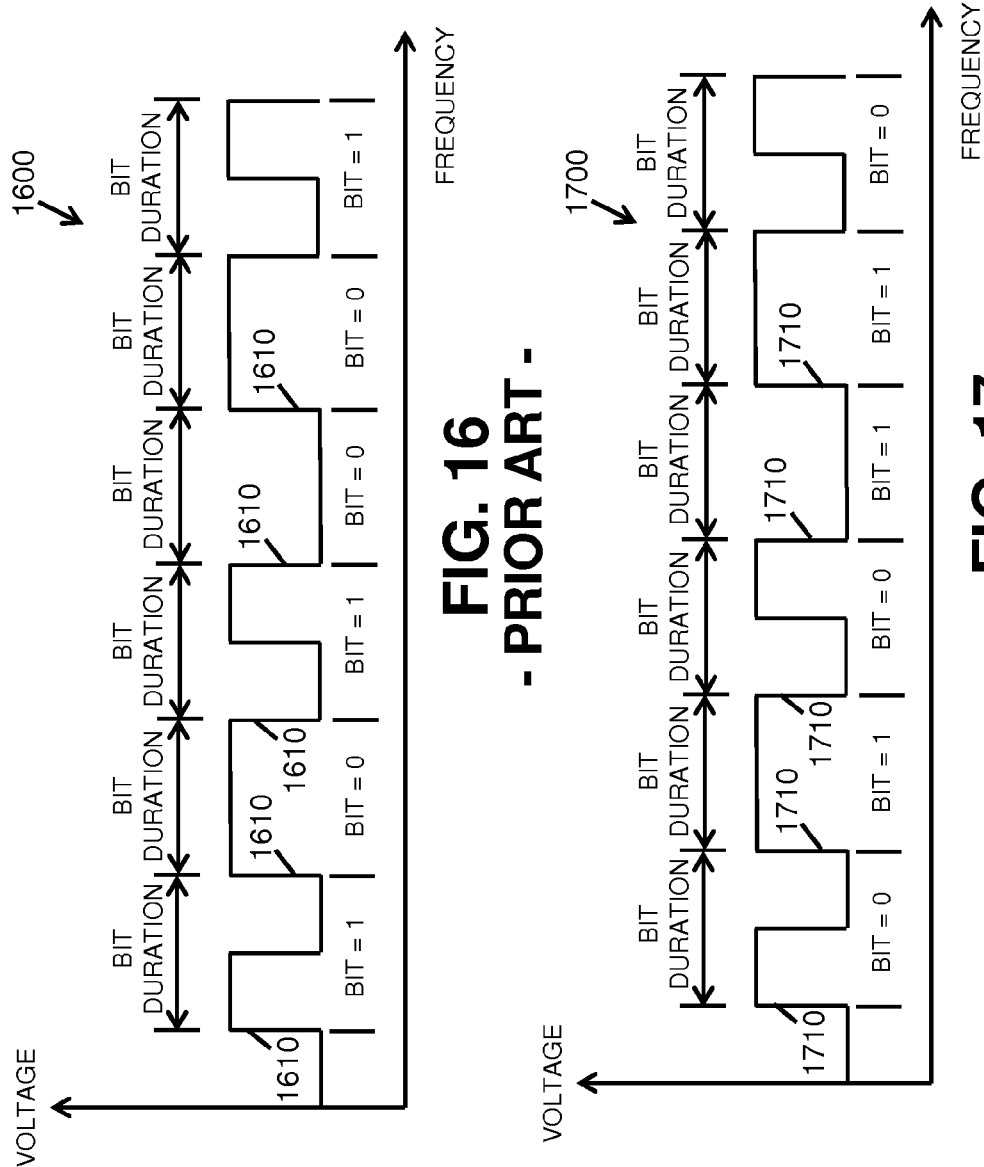

BASK DEMODULATOR AND METHOD FOR DEMODULATING BASK MODULATED SIGNAL

BACKGROUND OF THE INVENTION

The present invention relates to wireless communication and, more particularly, to a Binary Amplitude Shift Key (BASK) demodulator and a method for demodulating and decoding a BASK modulated signal.

Backscatter used in conjunction with BASK modulation is a simple and cost effective approach for communicating data across relatively short distances. This approach relies on inductive coupling of primary and secondary coils in which current/voltage in the secondary coil is BASK modulated. The modulated current/voltage affects the loading on the primary coil and therefore a BASK modulated signal is generated across the primary coil.

Demodulation of BASK modulated signals typically is performed by envelope detection. Although envelope detection is a simple and relatively inexpensive demodulation technique, it generally is only suitable for BASK modulated signals that have known limited range or expected logic 1 and logic 0 levels. Hence, for instance, when considering backscatter in conjunction with BASK modulation, the amplitude of the driving voltage or frequency may be adjusted to vary the power supplied to the primary coil. Consequently, the resulting maximum Amplitude Shift Keying (ASK) modulated signal values for logic 1 and 0 may vary considerably and thus may not be readily distinguishable by conventional envelope detection.

In addition to the above, information or signals transmitted by backscatter may be susceptible to glitches caused by electromagnetic interference. It therefore would be useful if the effects of such glitches are alleviated or at least reduced.

BRIEF DESCRIPTION OF THE DRAWINGS

The invention, together with objects and advantages thereof, may best be understood by reference to the following description of preferred embodiments together with the accompanying drawings in which:

FIG. 16 is a waveform diagram illustrating a first prior art coded binary signal;

FIG. 17 is a waveform diagram illustrating a second prior art coded binary signal.

DETAILED DESCRIPTION OF PREFERRED EMBODIMENTS

Figure 1:
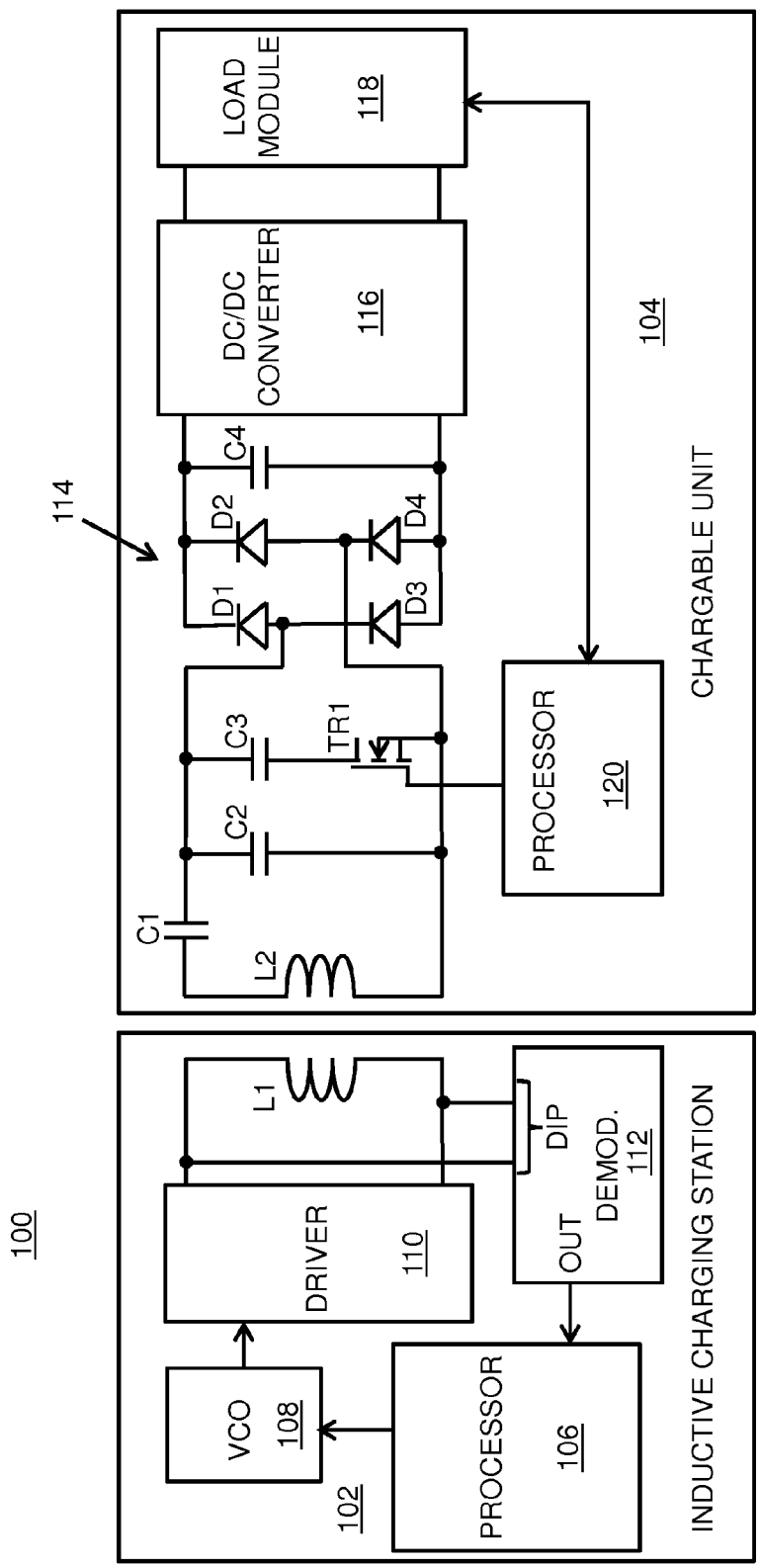
FIG. 1 is a schematic block diagram of an inductive charging station and associated inductively coupled chargeable unit in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element proceeded by "comprises . . . a" does not, without more constraints, preclude the existence of additional identical elements that comprises the element.

In one embodiment, the present invention provides a Binary Amplitude Shift Keying (BASK) demodulator for providing a binary demodulated signal of a BASK modulated signal having a variable frequency carrier signal that is variable between a minimum and a maximum carrier frequency. The demodulator includes a signal modifying circuit having input terminals and a signal modifying circuit output and the signal modifying circuit includes a signal scaling circuit, a rectifying circuit and an AC coupling circuit. A low pass filter couples a signal amplifier circuit to the modifying circuit output. A signal shaping circuit couples an output of the signal amplifier circuit to an output of the demodulator.

In operation the signal scaling circuit scales the BASK modulated signal received at the input terminals to provide an unclipped scaled and biased alternating signal. The unclipped scaled and biased alternating signal alternates about a bias voltage at a signal frequency of at least the minimum carrier frequency, and the rectifying circuit rectifies the unclipped scaled and biased alternating signal to provide a partially rectified signal. The AC coupling circuit decouples the partially rectified signal to provide a clipped scaled and biased alternating signal. The clipped scaled and biased alternating signal alternates about a bias voltage at a signal frequency of at least the minimum carrier frequency, and the low pass filter removes the signal frequency from the clipped scaled and biased alternating signal to provide a demodulated signal. The demodulated signal is amplified by the signal amplifier circuit and shaped by the signal shaping circuit to thereby provide the binary demodulated signal at the output of the demodulator.

In another embodiment the present invention provides a method for demodulating a BASK modulated signal having a variable frequency carrier signal that is variable between a minimum and a maximum carrier frequency. The method is performed by a demodulator and the method includes scaling the BASK modulated signal to provide an unclipped scaled and biased BASK modulated signal that alternates about a bias voltage at a signal frequency of at least the minimum carrier frequency. Next a process of partially rectifying the unclipped scaled and biased BASK modulated signal is performed to provide a partially rectified signal, and then the partially rectified signal is decoupled to provide a clipped scaled and biased alternating signal, which alternates about a bias voltage at a signal frequency of at least the minimum carrier frequency. Low pass filtering of the clipped scaled and biased alternating signal is performed to remove the signal frequency therefrom and provide a demodulated signal. The demodulated signal is then amplified to provide an amplified demodulated signal and then the amplified demodulated signal is shaped to provide the binary demodulated signal.

In another embodiment the present invention provides a method for decoding logic values of encoded sequential data bits forming at least part of a coded binary signal. The coded binary signal comprises pre-defined individual data bit durations bounded by binary logic state transitions. Individual data bit durations that have a continuous binary logic state are encoded as a first logic value and individual data bit durations that have more than one binary logic state are encoded as a second logic value. The method is performed by a processor. The method includes detecting an initial transition to indicate commencement of a current data bit duration. The method provides for selectively updating one of first and second accumulators. The first accumulator tracks the time of the current data bit duration when at the first logic value, and the second accumulator tracks the time of the current data bit duration when at the second logic value. The method also provides for identifying an end of current data bit duration transition to indicate completion of the current data bit duration. The method then effects a calculation by comparing a value stored in the first accumulator with a value stored in the second accumulator to provide a difference value. Then a process of determining the logic value of the current data bit duration based on the difference value is performed.

Referring now to FIG. 1, a schematic block diagram of a system 100 comprising an inductive charging station 102 and associated inductively coupled chargeable unit 104 in accordance with a preferred embodiment of the present invention is shown. The inductive charging station 102 has a processor 106 with an output coupled to a Voltage Controlled Oscillator (VCO) 108. However, in other embodiments the function of the VCO 108 can be performed by the processor 106. The VCO 108, or alternatively the processor 106, has an output that provides a sinusoidal signal S1 to an input of a driver 110. The sinusoidal signal S1 has a frequency F1 that can vary, typically from 100 KHz to 205 KHz, depending on control signals sent to from the processor 106.

The driver 110 includes a power amplifier circuit with output terminals coupled to a primary coil L1 and input terminals DIP of a BASK Demodulator 112 that has an output OUT coupled to an input of the processor 106.

The chargeable unit 104 has a secondary coil L2 that can be positioned to be inductively coupled to the primary coil L1. Coupled across output terminals of secondary coil L2 are series connected capacitors C1 and C2. There is also a series coupled transistor TR1 and capacitor C3 connected across capacitor C2. Connected across capacitor C2 is a bridge rectifier circuit 114 comprising four diodes D1, D2, D3 and D4. Outputs of the bridge rectifier circuit 114 are coupled to a DC/DC converter 116 and a smoothing capacitor C4 is coupled across the outputs of the bridge rectifier circuit 114. Output of the DC/DC converter 116 is coupled to a load module 118. The chargeable unit 104 also has a processor 120 coupled to the load module 118 and an output of the processor 120 is coupled to a gate of the transistor TR1.

The DC/DC converter 116 converts the rectified voltage at the output of bridge rectifier circuit 114 to a suitable DC voltage level coupled across the input of load module 118. The DC/DC converter 116 helps reduce ripple, provides power limitation characteristics and improves dynamic response to load module 118.

The load module 118 includes a chargeable battery, the status of which is monitored by the processor 120. In operation, when the primary and secondary coils L1, L2 are in close proximity and inductively coupled together, the driver 110 provides power to the primary coil L1 at the frequency F1 which may vary between 100 KHz to 205 KHz. Since the secondary coil L2 is inductively coupled to the primary coil L1, a voltage is induced at the output terminals of secondary coil L2 which provides a charging current to the load module 118. This charging current is rectified by the bridge rectifier circuit 114, smoothed by the smoothing capacitor C4 and converted by the DC/DC converter 116.

Backscatter BASK modulation is used by the system 100 to allow the chargeable unit 104 to communicate with the charging station 102 to provide a current battery charge status of the load module 118 and a suitable charging profile. The backscatter BASK modulation technique is achieved by the processor 120 sending Pulsed Control Signals PCS to the gate of the transistor TR1 to selectively connect and disconnect the capacitor C3 across capacitor C2. The Pulsed Control Signals PCS represent data and the selective connecting and disconnecting of the capacitor C3 across capacitor C2 affects the voltage across the output terminals of secondary coil L2. In this embodiment, the Pulsed Control Signals PCS have a maximum duration of 500 uS which equates to a single Data Bit Duration DBD. The loading on the secondary coil L2 caused by connecting and disconnecting of the capacitor C3 affects the voltage across the inductively coupled primary coil L1. As a result of this loading, the voltage at the inductively coupled primary coil L1 varies in a manner dependent on Data DA represented by the Pulsed Control Signals PCS present in a BASK modulated signal MSI. The BASK modulated signal MSI has a Carrier Signal CS oscillating at the frequency F1 and a single Data Bit Duration DBD of 500 uS.

The demodulator 112 demodulates the modulated signal MSI to provide a Binary Demodulated Signal BDSI and the processor 106 processes this Binary Demodulated Signal BDSI and performs data recognition to identify the data coded in the Binary Demodulated Signal BDSI. The processor 106 may then send control signals to modify the output frequency of VCO 108. The modifying of the output frequency may be required if the power output of the primary coil L1 needs to be adjusted due to the data received in the Modulated Signal MSI. Once the battery in the load module 118 is fully charged, the chargeable unit 104, which can be any portable battery powered device, can be moved away from the charging station as will be apparent to a person skilled in the art.

Figure 2:
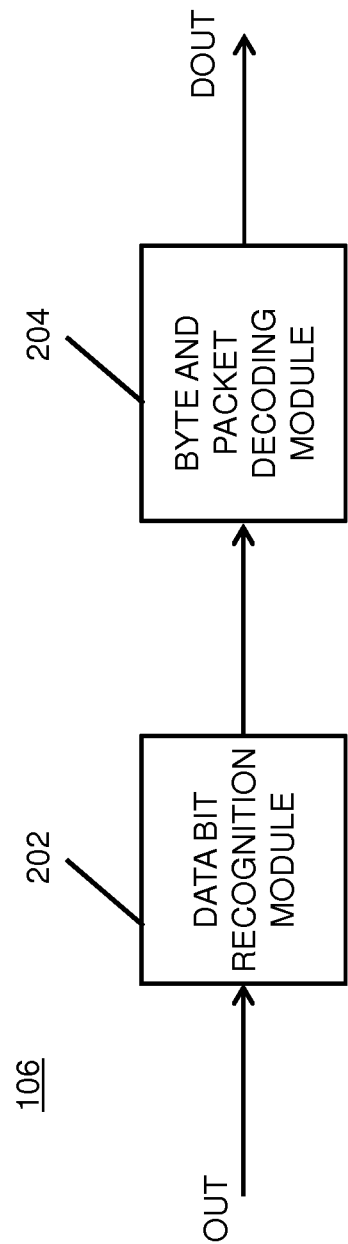
FIG. 2 is a schematic block diagram of modules forming part of a processor of the inductive charging station of FIG. 1, in accordance with a preferred embodiment of the present invention.

Referring to FIG. 2, a schematic block diagram of modules forming the processor 106, in accordance with a preferred embodiment of the present invention, is shown. The processor 106 includes a data bit recognition module 202 for processing signals from the output OUT of the demodulator 112 and an output of the data bit recognition module 202 is coupled to a byte and packet decoding module 204. The decoding module 204 has a decoded output for controlling the driver 110.

Figure 3:
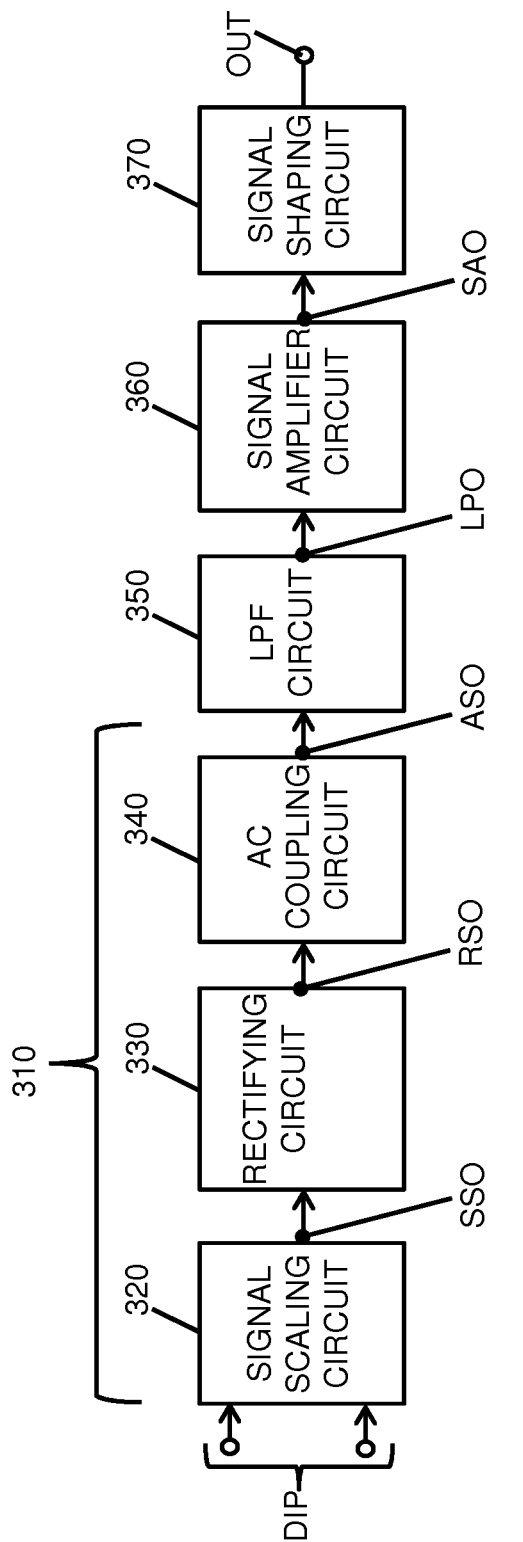
FIG. 3 is a schematic block diagram of the BASK demodulator of FIG. 1, in accordance with a preferred embodiment of the present invention.

FIG. 3 is a schematic block diagram of the BASK demodulator 112 in accordance with a preferred embodiment of the present invention. The demodulator 112 includes a signal modifying circuit 310 that has input terminals that are the input terminals DIP of the demodulator 112 and an output of the signal modifying circuit 310 is coupled to an input of a low pass filter (LPF) circuit 350. The signal modifying circuit 310 includes a signal scaling circuit 320 with input terminals DIP and an output SSO coupled to an input of rectifying circuit 330. An output RSO of the rectifying circuit 330 is coupled to an input of an AC coupling circuit 340 that has an output ASO which is the output of the signal modifying circuit 310.

An output LPO of the LPF circuit 350 is coupled to an input of a signal amplifier circuit 360 that has an output SAO coupled to an input of a signal shaping circuit 370. The signal shaping circuit 370 has an output which is the output OUT of the demodulator 112.

Figure 4:
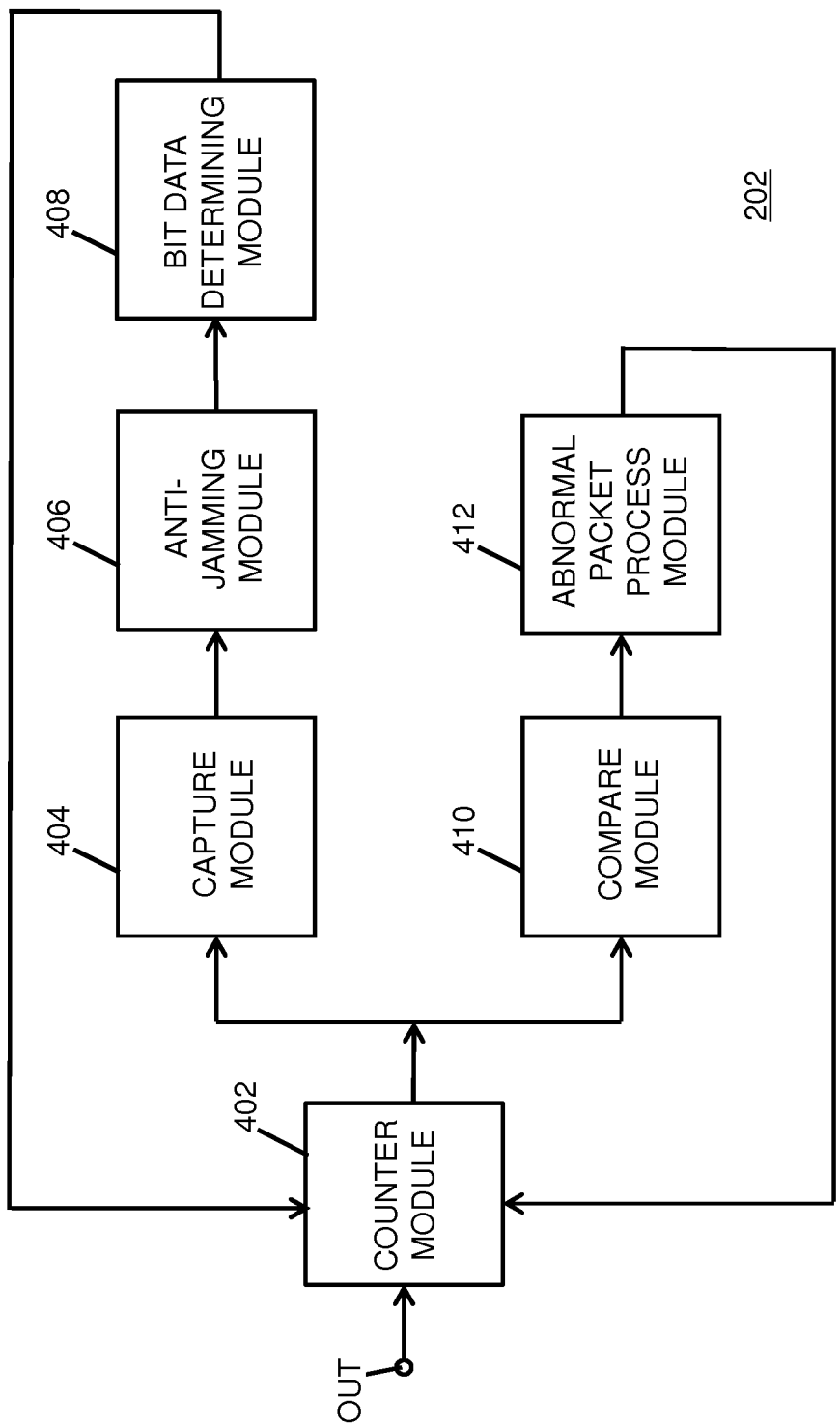
FIG. 4 is a schematic block diagram of data bit recognition module of the processor of FIG. 2, in accordance with a preferred embodiment of the present invention.

FIG. 4 is a schematic block diagram of the data bit recognition module 202, which forms part of the processor 106, in accordance with a preferred embodiment of the present invention. The data bit recognition module 202 includes a counter module 402 that has a high resolution clock (from on-chip or alternatively an off-chip source). An input of the counter module 402 receives a differential bi-phase waveform from the output of the demodulator 112 the waveform of which is described below in FIGS. 16 and 17. When a waveform that complies with expected timing constraints is received by the counter module 402, the waveform will be processed by a capture module 404 that has input anti-jamming module 406 and a bit data determining module 408. An output of the bit data determining module 408 is coupled to reset the counter module 402 after a data bit has been determined. Alternatively, when a waveform that does not comply with expected timing constraints is received by the counter module 402, the waveform will be processed by a compare module 410 and an abnormal packet process module 412. The abnormal packet process module 412 has output coupled to reset the counter module 402 to allow for processing further data bits of next correct packets.

Figure 5:
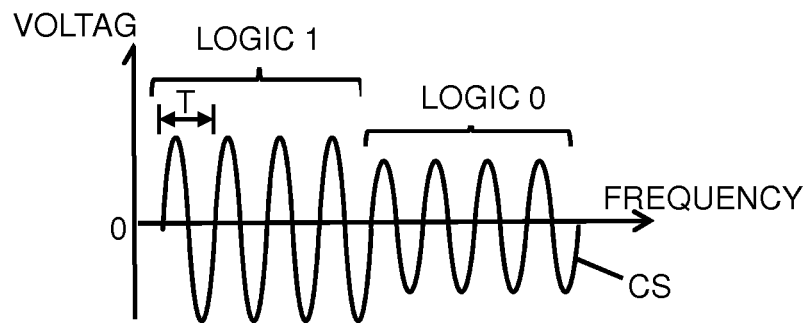
FIG. 5 is a waveform that is representative of a BASK modulated signal provided at input terminals of the BASK demodulator of FIG. 3.

Referring to FIG. 5, there is illustrated a waveform that is representative of a BASK modulated signal MSI. The BASK modulated signal MSI is provided at the input terminals DIP of the demodulator 112. The BASK modulated signal MSI is formed from the Carrier Signal CS oscillating at the frequency F1. The frequency F1 is variable between a minimum frequency of 100 KHz and a maximum frequency of 205 KHz, and the signal MSI is the amplitude modulated binary Data DA with a single Data Bit Duration DBD of 500 uS. As shown, the BASK modulated signal MSI has a period T (where T=1/F1) that is amplitude modulated between a logic 1 condition and a logic 0 condition. As will be apparent to a person skilled in the art, in operation the actual amplitudes of the BASK modulated signal MSI may vary depending on the frequency F1 of the carrier signal CS.

Figure 6:
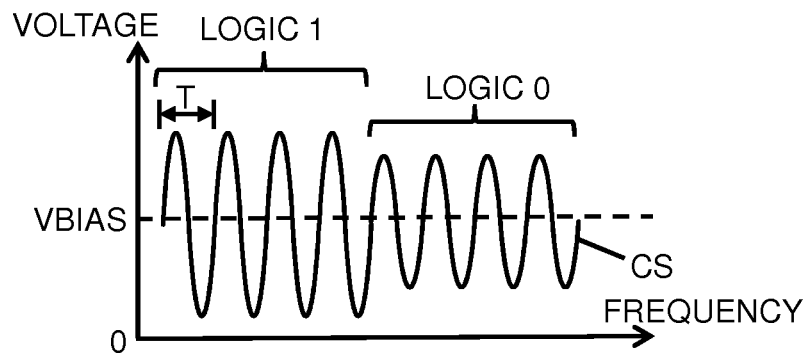
FIG. 6 is a waveform that is representative of a Scaled and Biased BASK modulated signal provided at an output of a signal scaling circuit of the demodulator of FIG. 3, in accordance with a preferred embodiment of the present invention.

Referring to FIG. 6, there is illustrated a waveform that is representative of an unclipped scaled and biased BASK modulated signal SBMSI provided at the output of the signal scaling circuit 320, in accordance with a preferred embodiment of the present invention. The unclipped scaled and biased BASK modulated signal SBMSI has a DC bias voltage VBIAS of typically 2.5 Volts and is a scaled and biased version of the BASK modulated signal MSI provided at the input terminals DIP. The DC bias voltage VBIAS is half the value of a supply line voltage used by the demodulator 112 and is described later. Furthermore, to avoid signal clipping, the unclipped Scaled and BASK modulated signal SBMSI has an amplitude swing either side of the bias voltage VBIAS of less than 2.5 Volts.

Figure 7:
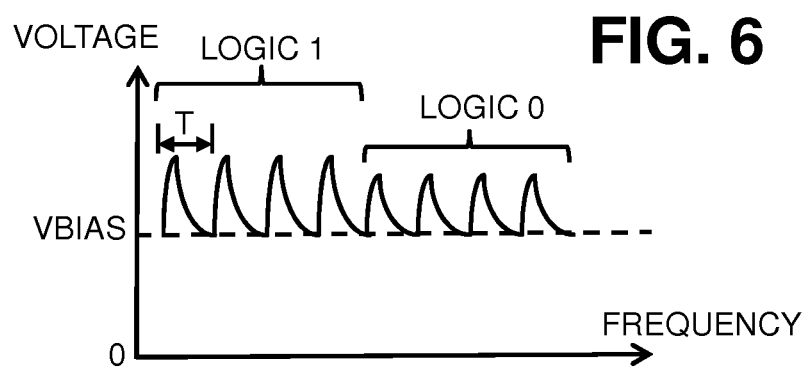
FIG. 7 is a waveform that is representative of a partially rectified signal provided at an output of a rectifying circuit of the demodulator of FIG. 3, in accordance with a preferred embodiment of the present invention.

Referring to FIG. 7, there is illustrated a waveform that is representative of a Partially Rectified Signal RS that is provided at the output of the rectifying circuit 330, in accordance with a preferred embodiment of the present invention. The Partially Rectified Signal RS is a half wave rectified and smoothed version of the scaled and biased BASK modulated signal SBMSI provided at the output of the signal scaling circuit 320. As shown, the Partially Rectified Signal RS still has a period T with varying amplitudes indicative of logic 1 and logic 0 conditions, however the Partially Rectified Signal RS is maintained above the DC bias voltage VBIAS.

Figure 8:
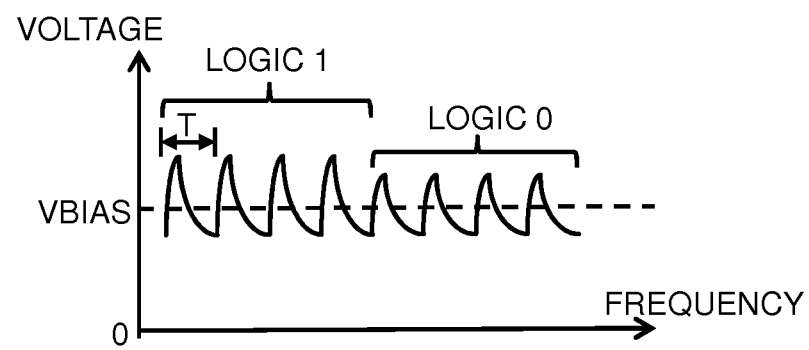
FIG. 8 is a waveform that is representative of an alternating signal provided at an output of an AC coupling circuit of the demodulator of FIG. 3, in accordance with a preferred embodiment of the present invention.

Referring to FIG. 8, there is illustrated a waveform that is representative of an Alternating Signal AS provided at the output of the AC coupling circuit 340, in accordance with a preferred embodiment of the present invention. The Alternating Signal AS is an AC version of the Partially Rectified Signal RS provided at the output of the rectifying circuit 330. The Alternating Signal AS still has a period T with varying amplitudes indicative of logic 1 and logic 0 conditions, however the Alternating Signal AS alternates about the DC bias voltage VBIAS.

Figure 9:
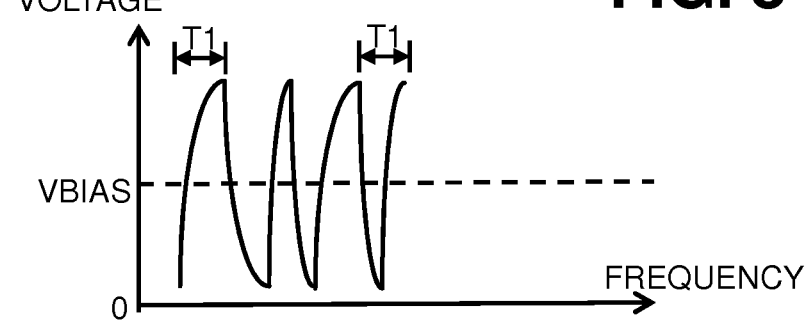
FIG. 9 is a waveform that is representative of analog demodulated signal provided at an output of a signal amplifier circuit of the demodulator of FIG. 3, in accordance with a preferred embodiment of the present invention.

Referring to FIG. 9, there is illustrated a waveform that is representative of an Analog Demodulated Signal ADSI provided at the output of the signal amplifier circuit 360, in accordance with a preferred embodiment of the present invention. The Analog Demodulated Signal ADSI is a filtered and amplified version of the Alternating Signal AS that has been low pass filtered by the LPF circuit 350 and then amplified by the signal amplifier circuit 360. This Analog Demodulated Signal ADSI has a modified period T1 of 500 uS, which is the same as the maximum duration of the Pulsed Control Signals PCS that are sent to the gate of the Transistor TR1 of the chargeable unit 104.

Figure 10:
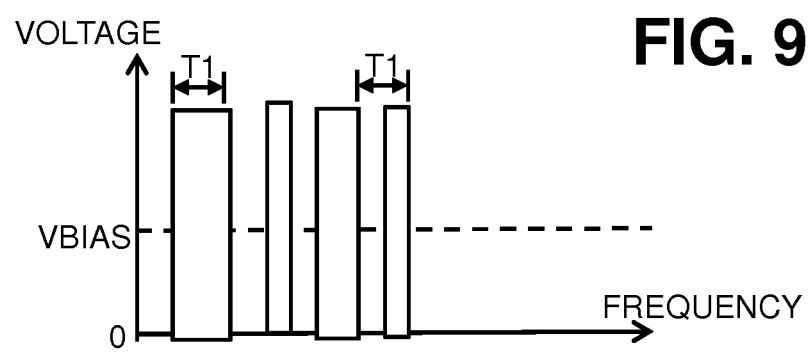
FIG. 10 is a waveform that is representative of a binary demodulated signal provided at an output of the signal shaping circuit forming of the demodulator of FIG. 3, in accordance with a preferred embodiment of the present invention.

Referring to FIG. 10, there is illustrated a waveform that is representative of the Binary Demodulated Signal BDSI provided at the output OUT of the signal shaping circuit 370, in accordance with a preferred embodiment of the present invention. The Binary Demodulated Signal BDSI is digital version of the Analog Demodulated Signal ADSI that has been shaped into digital pulses by the signal shaping circuit 370.

Figure 11:
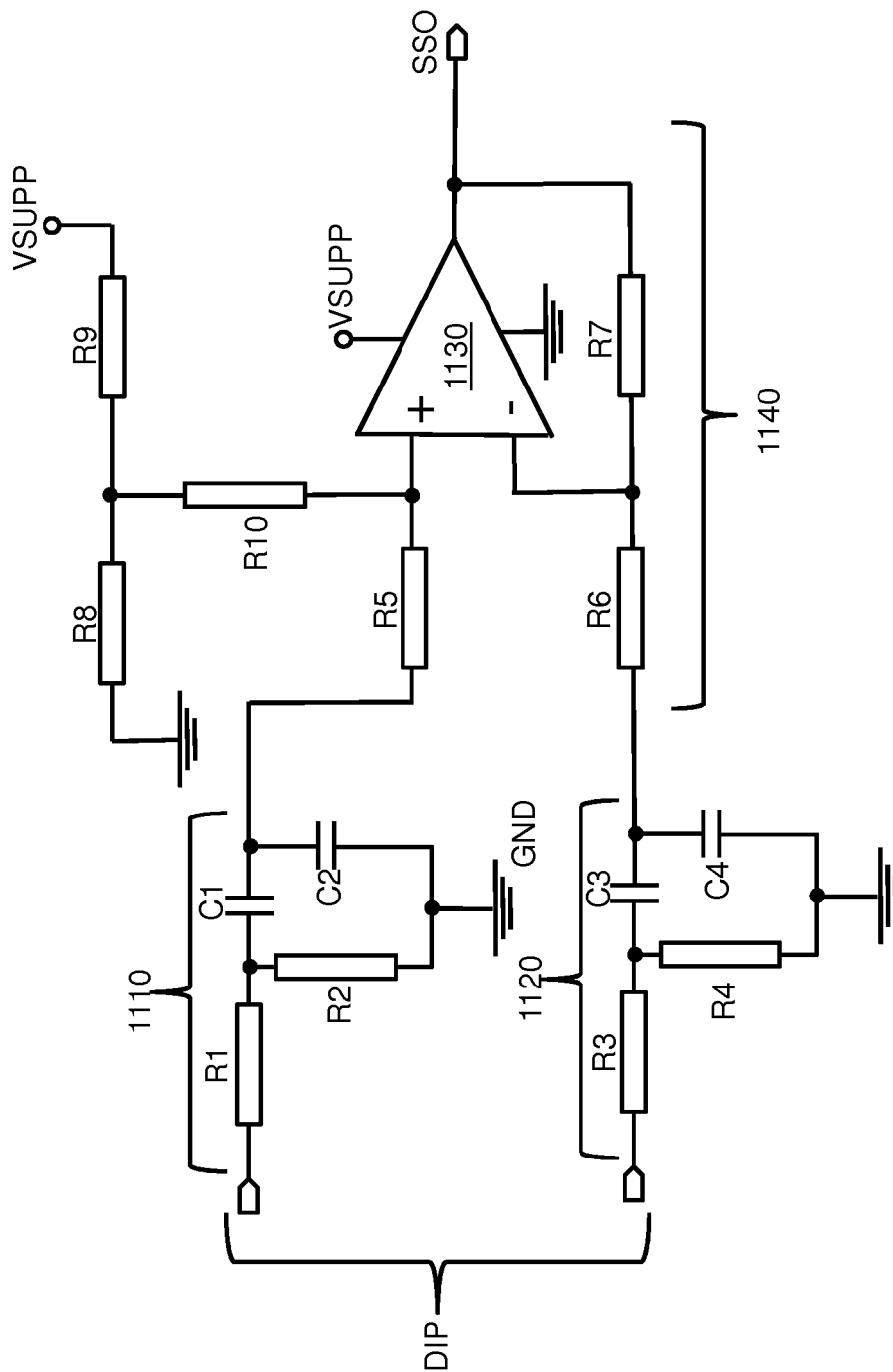
FIG. 11 is a schematic circuit diagram of the signal scaling circuit of FIG. 3, in accordance with a preferred embodiment of the present invention.

FIG. 11 is a schematic circuit diagram of the signal scaling circuit 320, in accordance with a preferred embodiment of the present invention. The two input terminals DIP of the signal scaling circuit 320 are coupled to a respective attenuation circuit 1110, 1120. The attenuation circuit 1110 comprises a voltage reduction resistor R1 coupled to a first one of the input terminals DIP. The voltage reduction resistor R1 is connected to ground GND through a resistor R2. The resistance of the voltage reduction resistor R1 is substantially larger than the resistance of the resistor R2 (typically R1>6*R2), and a common node between resistors R1 and R2 is coupled to a DC blocking capacitor C1 that is coupled to the ground line GND by a capacitor C2. The capacitance value of the DC blocking capacitor C1 is substantially larger than the capacitance value of capacitor C2 (typically C1>40*C2), and a common node between capacitors C1 and C2 is coupled through a resistor R5 to a non-inverting input of an operational amplifier 1130.

The attenuation circuit 1120 comprises a voltage reduction resistor R3 coupled to a second one of the input terminals DIP. This voltage reduction resistor R3 is connected to the ground line GND through a resistor R4. The resistance of the voltage reduction resistor R3 is substantially larger than the resistance of the resistor R4 (typically R3>3.5*R4), and a common node between resistors R3 and R4 is coupled to a DC blocking capacitor C3 that is coupled to the ground line GND by a capacitor C4. The capacitance value of the DC blocking capacitor C3 is substantially larger than the capacitance value of capacitor C4 (typically C3>40*C4), and a common node between capacitors C3 and C4 is coupled through a resistor R6 to an inverting input of the operational amplifier 1130.

The signal scaling circuit 320 also has two resistors R8 and R9 coupled across a power supply line VSUPP and the ground line GND. A common node between resistors R8 and R9 is coupled through a resistor R10 to the non-inverting input of the operational amplifier 1130. In this embodiment, the resistance of resistor R8 is equal to the resistance of resistor R9 and thus the voltage supplied to the non-inverting input of the operational amplifier 1130 is VSUPP/2. A feedback resistor R7 is coupled between an output of the operational amplifier 1130 and the inverting input of the operational amplifier 1130. The output of operational amplifier 1130 is also the output SSO of the signal scaling circuit 320 and in this specific embodiment the operational amplifier 1130 is configured as a differential amplifier 1140. Thus, in operation the non-inverting input (reference input) of the operational amplifier 1130 is both set to the bias voltage of VSUPP/2 and coupled to one of the input terminals DIP by the attenuator circuit 1110. Similarly, the inverting input of the operational amplifier 1130 is coupled to one of the input terminals DIP by the attenuator circuit 1120.

The gain of the differential amplifier 1140 is dependent on values of the resistors R5, R6, R7, R8, R9 and R10. In operation, the attenuation circuits 1110, 1120 in combination with the differential amplifier 1140 scale the BASK modulated signal MSI so that it has a peak to peak maximum amplitude swing of less than the 5 Volts potential provided at the power supply line VSUPP. Furthermore, since the DC reference voltage (bias voltage VBIAS) provided at the non-inverting input of the operational amplifier 1130 is VSUPP/2, the unclipped scaled and biased BASK modulated signal SBMSI, at the output SSO, has an amplitude swing either side of the bias voltage VBIAS of less than 2.5 Volts thereby avoiding signal clipping.

Figure 12:
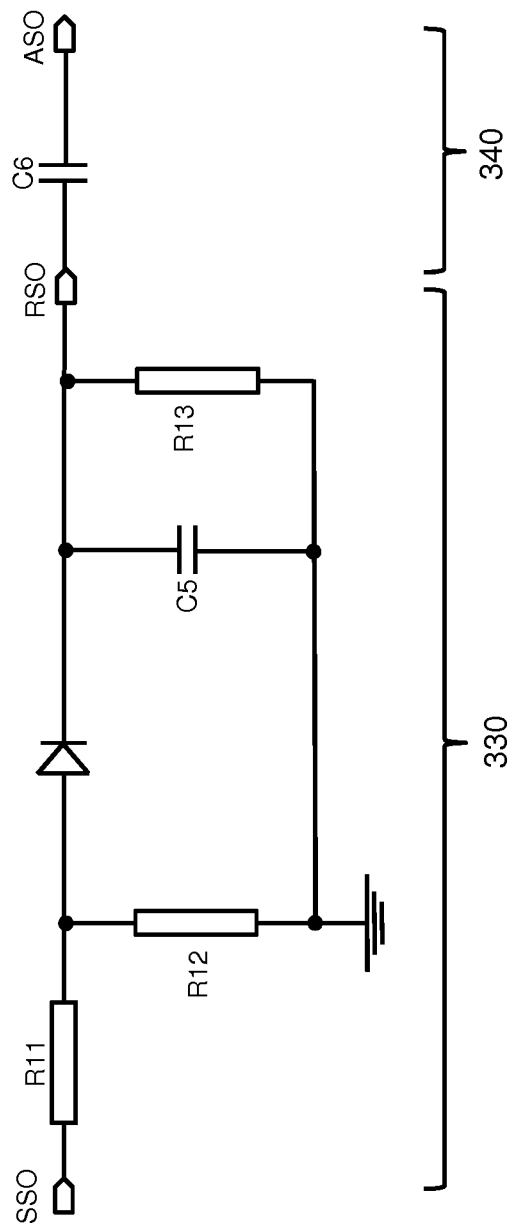
FIG. 12 is a schematic circuit diagram of the rectifying circuit and AC coupling circuit of FIG. 3, in accordance with a preferred embodiment of the present invention.

FIG. 12 is a schematic circuit diagram of the rectifying circuit 330 and AC coupling circuit 340, in accordance with a preferred embodiment of the present invention. In this embodiment the rectifying circuit 330 is a half wave rectifier with the input coupled to the output SSO of the signal scaling circuit 320. The input is coupled to the ground line GND through series connected resistors R11, R12, and a common node between resistors R11 and R12 is coupled to an anode of a diode D. A parallel connected smoothing capacitor C5 and discharge resistor R13 are coupled across a cathode of the diode D and the ground line GND. The cathode is also coupled to the output RSO of the rectifying circuit 330 which is the input of the AC coupling circuit 340. Consequently, the output RSO provides the Partially Rectified Signal RS to the input of the AC coupling circuit 340.

The AC coupling circuit 340 comprises a coupling capacitor C6 coupled between the output RSO of the rectifying circuit 330 and the output ASO of the AC coupling circuit 340. The coupling capacitor C6 typically has a relatively low reactance value at the frequency F1 of the carrier signal CS and in this embodiment the value of the coupling capacitor C6 is 0.1 uF. Thus, the output ASO provides the Alternating Signal AS to the LPF circuit 350.

Figure 13:
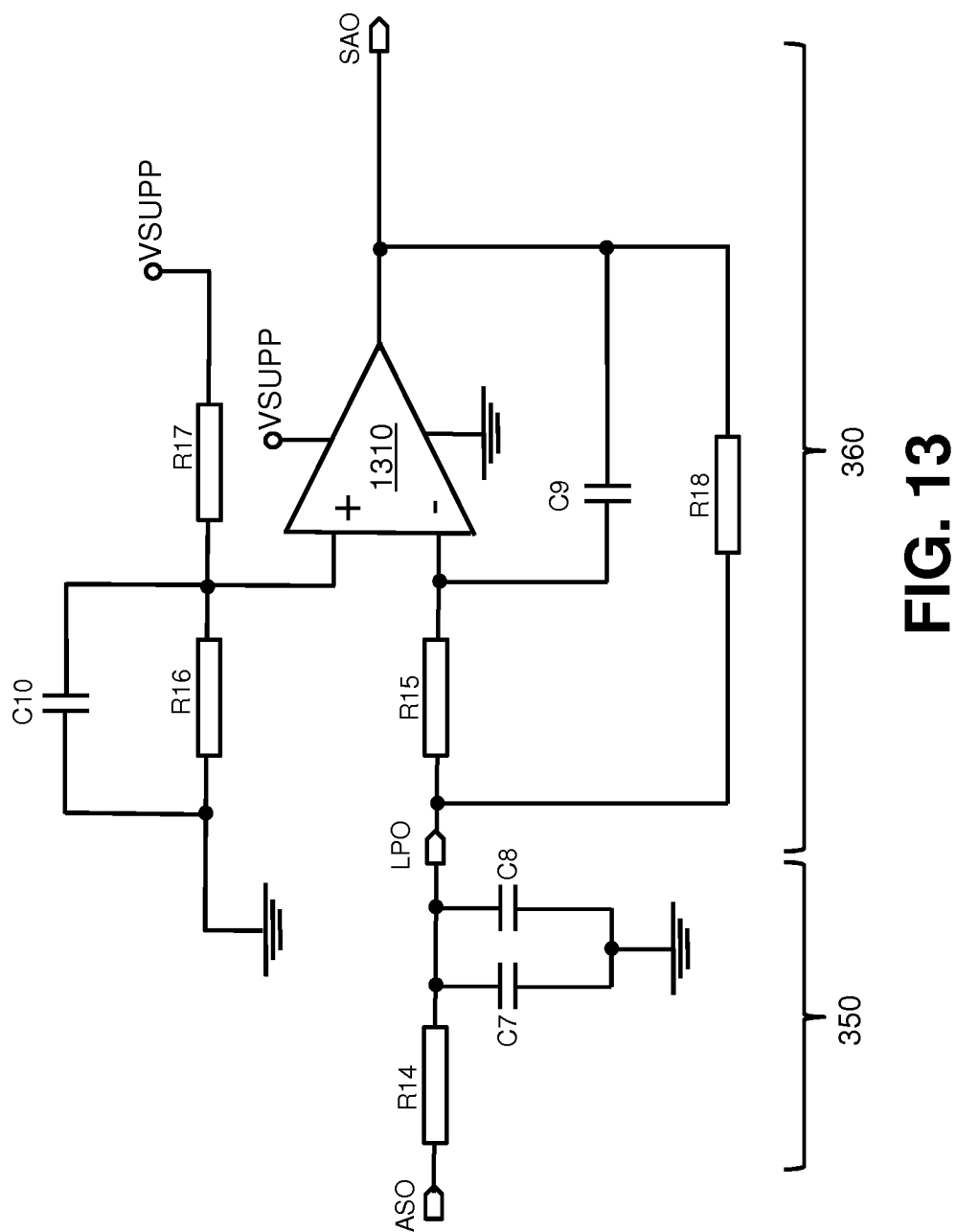
FIG. 13 is a schematic circuit diagram of the low pass filter circuit and signal amplifier circuit of FIG. 3, in accordance with a preferred embodiment of the present invention.

FIG. 13 is a schematic circuit diagram of the LPF circuit 350 and signal amplifier circuit 360, in accordance with a preferred embodiment of the present invention. The LPF circuit 350 includes an attenuation resistor R14 with a first end connected to the output ASO of the AC coupling circuit 340, and a second end connected to the output LPO of the LPF circuit 350. There are also two parallel connected capacitors C7, C8 coupled across the output LPO and ground line GND. In this embodiment, the combined capacitance of capacitors C7, C8 is 11 nF and the resistance of attenuation resistor R14 is 4.3 k Ohms. As a result, the cut off frequency Fc of the LPF circuit 350 is approximately 21 KHz.

The signal amplifier circuit 360 includes a resistor R15 coupling the output LPO of the LPF circuit 350 to an inverting input of an operational amplifier 1310. There are two resistors R16 and R17 coupled across the power supply line VSUPP and the ground line GND. A common node between resistors R16 and R17 is coupled directly to a non-inverting input of the operational amplifier 1310 and a decoupling capacitor C10 is connected across the common node and ground line GND. In this embodiment, the resistance of resistor R16 is equal to the resistance of resistor R17 and thus the voltage supplied to the non-inverting input of the operational amplifier 1310 is VSUPP/2. There is also a feedback capacitor C9 coupled between an output of the operational amplifier 1310 and the inverting input of the operational amplifier 1310, and a feedback resistor R18 is connected between the output of the operational amplifier 1310 and the output LPO of the low pass filter circuit 350. The output of operational amplifier 1310 is also the output SAO of the signal amplifier circuit 360 and in this specific embodiment the operational amplifier 1310 is configured as an integrator or integrating amplifier. Consequently, the output SAO supplies the Analogue Demodulated Signal ADSI to the signal shaping circuit 370.

Figure 14:
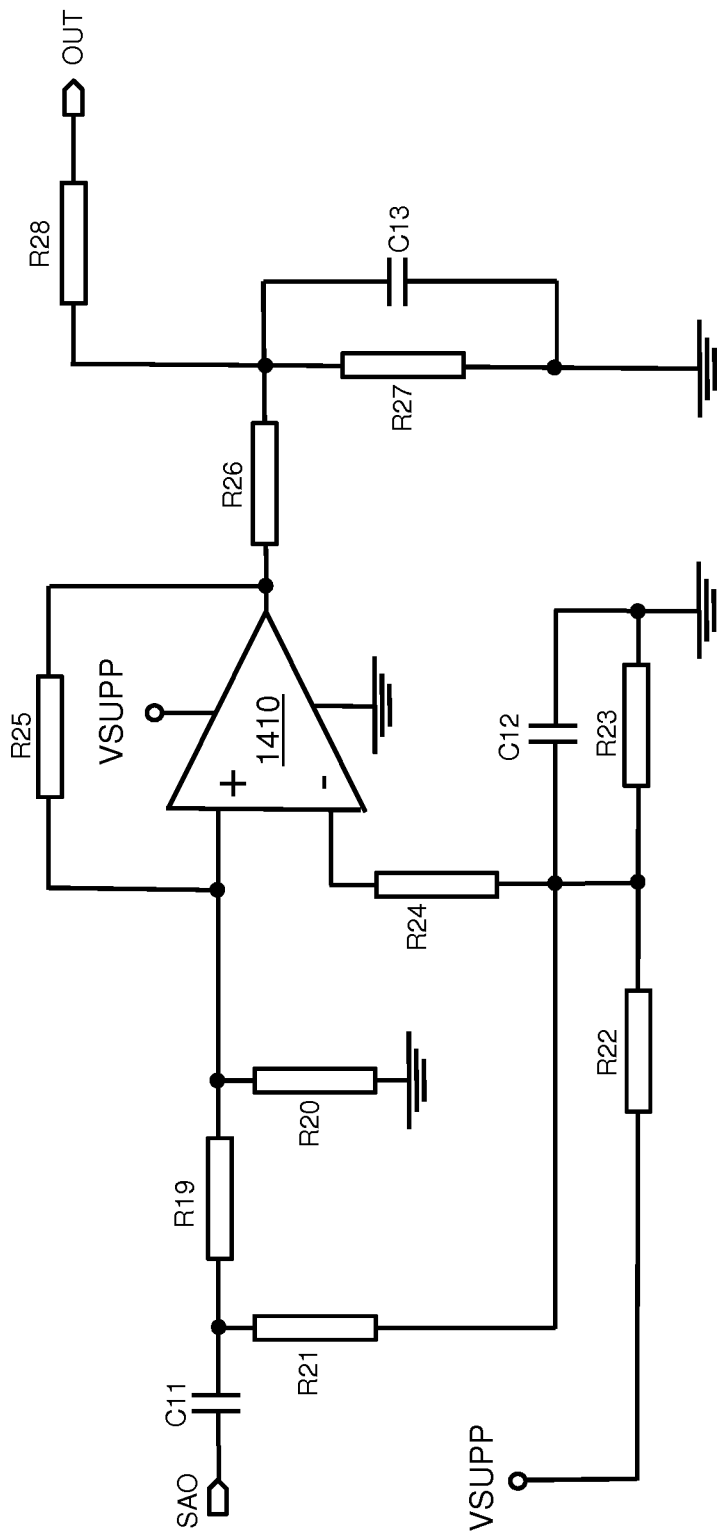
FIG. 14 is a schematic circuit diagram of the signal shaping circuit of FIG. 3, in accordance with a preferred embodiment of the present invention.

FIG. 14 is a schematic circuit diagram of the signal shaping circuit 370, in accordance with a preferred embodiment of the present invention. The signal shaping circuit 370 includes a DC blocking capacitor C11 with a first end connected to the output SAO of the signal amplifier circuit 360, and a second end connected to resistors R19 and R21. Resistor R19 couples the second end of the capacitor C11 to a non-inverting input of an operational amplifier 1410. Two resistors R22 and R23 are coupled across the power supply line VSUPP and the ground line GND. A common node between resistors R22 and R23 is coupled through a resistor R24 to the inverting input of the operational amplifier 1410 and a decoupling capacitor C12 is connected across the common node of resistors R22, R23 and ground line GND. In this embodiment, the resistance of resistor R22 is equal to the resistance of resistor R23 and thus the voltage supplied to the inverting input of the operational amplifier 1410 is VSUPP/2.

The resistor R21 couples the second end of the DC blocking capacitor C11 to the common nodes of resistors R22, R23 and a resistor R20 couples the non-inverting input of the operational amplifier 1410 to the ground line GND. There is also a feedback resistor R25 coupled between an output of the operational amplifier 1410 and the non-inverting input of the operational amplifier 1410. It will therefore be apparent to a person skilled in the art that the operational amplifier 1410 is configured as a hysteresis comparator that has the characteristic of providing square wave output signal which is the Binary Demodulated Signal BDSI. Furthermore, the output of the operational amplifier 1410 is coupled to the output OUT of the Demodulator 112 through series connected resistors R26 and R28. Also, a common node between resistors R26 and R28 is coupled to the ground line GND through a parallel connected capacitor C13 and resistor R27.

In summary, the BASK demodulator 112 has a signal modifying circuit 310 and the LPF circuit 350 couples the signal amplifier circuit 360 to the modifying circuit output ASO. The signal shaping circuit couples the output SAO of the signal amplifier circuit 360 to the output OUT of the demodulator 112. The signal modifying circuit includes the signal scaling circuit 320, a rectifying circuit 330 and an AC coupling circuit 340. In operation, the signal scaling circuit 320 scales the BASK modulated signal MSI, received at the input terminals DIP, to provide an unclipped scaled and biased alternating signal SBMSI that alternates about a bias voltage at a signal frequency of at least the minimum carrier frequency F1. The rectifying circuit 330 rectifies the unclipped scaled and biased alternating signal to provide the Partially Rectified Signal RS. The AC coupling circuit decouples the partially rectified signal to provide a clipped scaled and biased Alternating Signal AS. The LPF circuit 350 removes the signal frequency from the clipped scaled and biased Alternating Signal AS to provide the demodulated signal that is amplified by the signal amplifier circuit 360 and shaped by the signal shaping circuit 370 to provide the Binary Demodulated Signal BDSI at the output OUT of the demodulator 112.

Figure 15:
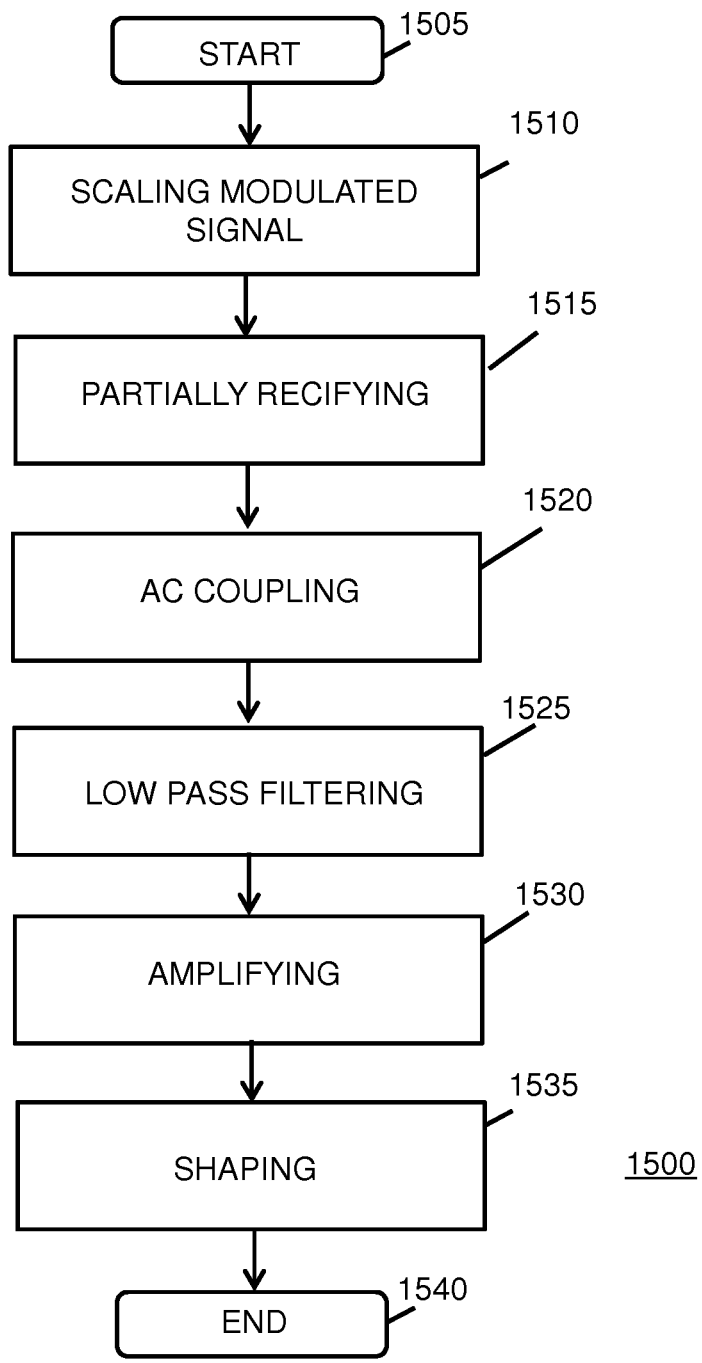
FIG. 15 is a flow chart illustrating a method for demodulating a BASK modulated signal in accordance with a preferred embodiment of the present invention.

Referring to FIG. 15, a flow chart illustrating a method 1500 for demodulating a BASK modulated signal MSI in accordance with a preferred embodiment of the present invention. The method 1500 is performed by the demodulator 112 and the method is initiated at a start block 1505. Next, at a scaling block 1510, there is performed a process of scaling the BASK modulated signal MSI to provide the unclipped scaled and biased BASK modulated signal SBMSI that alternates about a bias voltage at a signal frequency of at least the minimum carrier frequency F1. This process of scaling includes attenuating the BASK modulated signal MSI with attenuators of each of attenuation circuit 1110. The method 1500, at a block 1515, then performs partially rectifying the unclipped scaled and biased BASK modulated signal to provide a partially rectified signal RS. At a block 1520, there is performed AC coupling of the partially rectified signal RS to provide a clipped scaled and biased Alternating Signal AS.

At a block 1525, there is performed low pass filtering of the clipped scaled and biased Alternating Signal AS to remove the signal frequency and provide a demodulated signal. Next, at a block 1530, the method 1500 performs amplifying the demodulated signal to provide an amplified demodulated signal which is the analog demodulated signal ADSI. At a block 1535 the method 1500 performs shaping the amplified demodulated signal to provide the Binary Demodulated Signal BDSI and then the method 1500 terminates at an end block 1540.

Referring to FIG. 16, there is shown a waveform diagram illustrating a first prior art coded binary signal 1600. The first coded binary signal 1600 is typically the Binary Demodulated Signal BDSI provided at the output OUT of the Demodulator 112 and includes encoded sequential data bits forming at least part of the coded binary signal 1600. The coded binary signal 1600 has pre-defined individual data bit durations (BIT DURATION) bounded by binary logic state transitions 1610.

There are two encoded logic values in the coded binary signal 1600. Individual data bit durations that have a continuous binary logic state of zero or one are encoded as a first logic value (BIT=0) which is a logic value 0. In contrast, individual data bit durations that have more than one binary logic state of both zero and one are encoded as a second logic value (BIT=1) which is a logic value 1. More specifically, the individual data bit durations that have more than one binary logic state transition between binary logic states after a time expiration of half the bit duration. Thus, the data bit durations that have more than one binary logic state spend 50% of a bit duration at logic state 1 and 50% of a bit duration at logic state 0. It will therefore be apparent to a person skilled in the art that the coded binary signal 1600 complies with the Wireless Power Consortium Qi standard.

Referring to FIG. 17, there is shown a waveform diagram illustrating a second prior art coded binary signal 1700. The second coded binary signal 1700 is typically the Binary Demodulated Signal BDSI provided at the output OUT of the Demodulator 112 and includes encoded sequential data bits forming at least part of the coded binary signal 1700. The coded binary signal 1700 has pre-defined individual data bit durations DBD (BIT DURATION) bounded by binary logic state transitions 1710.

There are two encoded logic values in the coded binary signal 1700. Individual data bit durations that have a continuous binary logic state of zero or one are encoded as a first logic value (BIT=1) which is a logic value 1. In contrast, individual data bit durations that have more than one binary logic state of both zero and one are encoded as a second logic value (BIT=0) which is a logic value 0. More specifically, the individual data bit durations that have more than one binary logic state transition between binary logic states after a time expiration of half the bit duration. Thus, the data bit durations that have more than one binary logic state spend 50% of a bit duration at logic state 1 and 50% of a bit duration at logic state 0.

Figure 18:
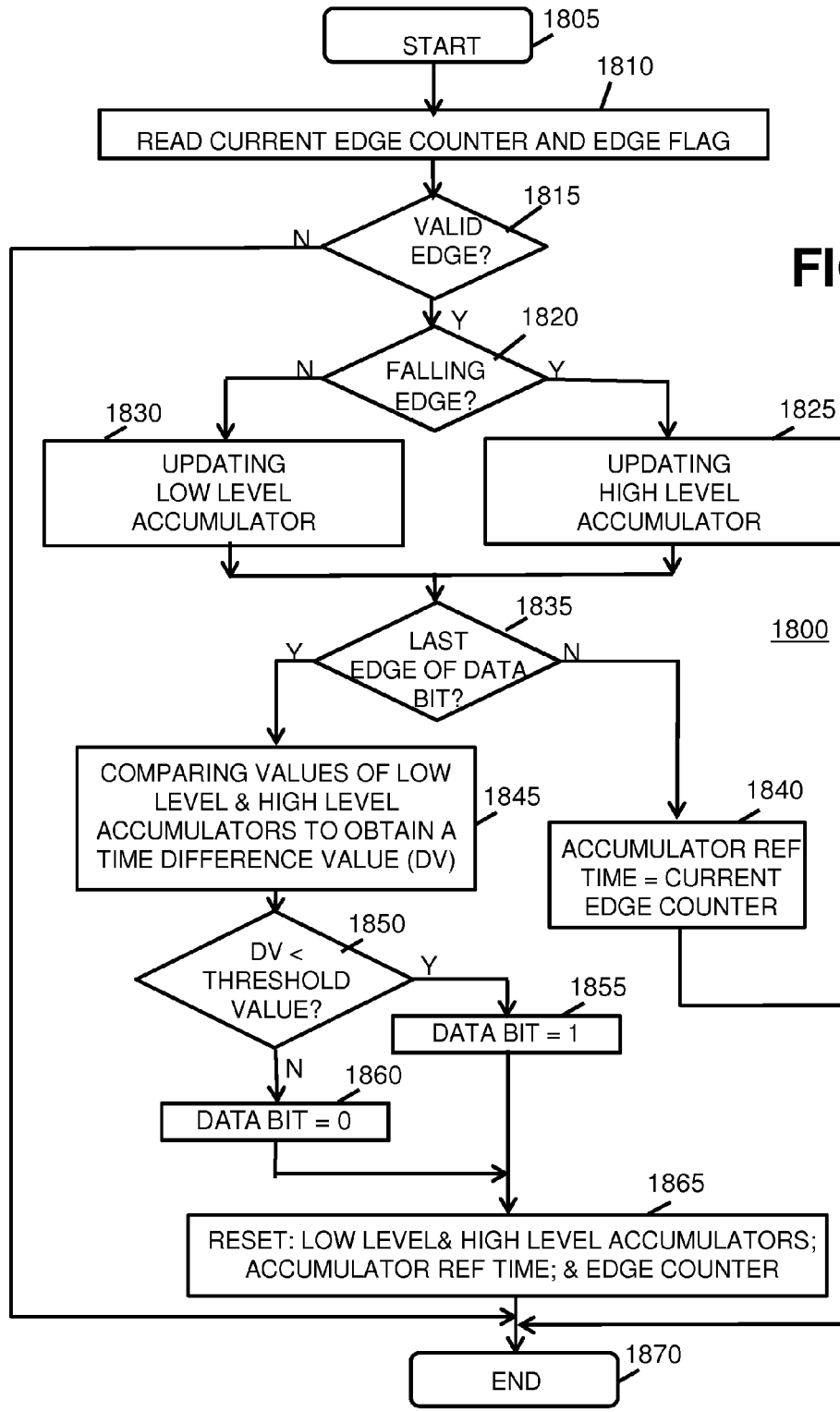
FIG. 18 is a flow chart illustrating a method for decoding logic values of encoded sequential data bits in accordance with a preferred embodiment of the present invention.

Referring to FIG. 18, a flow chart illustrating a method 1800 for decoding logic values of encoded sequential data bits in accordance with a preferred embodiment of the present invention is shown. The method will be explained with reference to first prior art coded binary signal 1600, however the method 1800 may also be used to decode other coded signals such as the second prior art coded binary signal 1700.

The method 1800, typically performed by the processor 106, is invoked at a start block 1805 after detecting a transition. A current edge timer CET (the timer module 402) is reset and begins counting from zero value by the ending transition of the last bit (or the initial transition of the current bit). When a followed transition is detected, a counter number is stored by capture module 404 and an edge flag EFLG is set to indicate the transition type (rising or falling edge). At a block 1810 the current edge timer CET and edge flag EFLG are read and at a block 1815 the transition (or edge) is assessed to determine if it is valid. The transition (or edge) is valid if the current edge timer CET has a value indicative of a period of less than the maximum allowable duration which in this specific example is 625 uS. This maximum allowable duration is based on an expected bit duration of 500 uS.

The method 1800, at a decision block 1820, then determines if the transition is a falling edge by checking the status of the edge flag EFLG. The method 1800 then performs a process selectively updating one of two accumulators. These accumulators are a first accumulator A1 and a second accumulator A2 and the selection of the accumulators is dependent on the status of the edge flag EFLG. The first accumulator A1 is a high level accumulator that is updated at a block 1825 when the status of the edge flag EFLG indicates the transition is a falling edge. In contrast, the second accumulator A2 is a low level accumulator that is updated at a block 1830 when the status of the edge flag EFLG indicates the transition is a rising edge. Thus, the first accumulator A1 tracks the time of the current data bit duration when at the first logic value (logic 1) and the second accumulator A2 tracks the time of the current data bit duration when at the second logic value (logic 0).

The method 1800, at a decision block 1835, determines if the transition is a last edge of a data bit. Since the expected bit duration is 500 uS then the transition is deemed to be the last edge of a data bit when the current edge timer CET has a value indicative of a period between 437 uS and 625 uS. This is achieved by comparing the time duration between the ending transition of last bit (or the initial transition of current bit) and a further transition to determine if a threshold period has been reached. If the decision block 1835 determines that the transition is not a last edge of a data bit, then at a block 1840, the value of the current edge timer CET is stored in an accumulator reference timer (ART). The method then terminates at the end block 1870. When the method 1800 is invoked again by a transition which is deemed valid at block 1815 one of the accumulators is selectively updated. More specifically, the first accumulator A1, if selected, is updated by the procedure A1=A1+(CET−ART), and the second accumulator A2, if selected, is updated by the procedure A2=A2+(CET−ART).

When the decision block 1835 determines that the transition is a last edge of a data bit, the method 1800 has essentially performed a process of identifying an end of current data bit duration transition. This identified end of current data bit duration transition indicates completion of the current data bit duration and the method 1800 performs a process of comparing. The process of comparing is performed at a block 1845 in which a value stored in the first accumulator A1 is compared with a value stored in the second accumulator A2 to provide a difference value DV. The difference value DV is compared with a threshold value TV at a comparison block 1850. The comparison block 1850 provides for determining the logic value of the current data bit duration based on the difference value DV. This difference value DV is an absolute value obtained from subtracting the values stored in the first and second accumulators A1, A2. When the absolute value is greater than a threshold value TV the logic value is determined to a first logic value of logic 0 at block 1860. Alternatively, when the absolute value is less than the threshold value TV, the logic value is determined to be a second logic value of logic 1 at block 1855.

The threshold value TV is typically set to 50 uS. This is because the coded binary signal 1600 has coded bits with data bit durations with continuous binary logic state of zero or one encoded as a logic value 0 and data bit durations that spend 50% at logic state 1 and 50% at logic state 0 are encoded as a logic value 1. Thus a data bit duration encoded as a logic 0 will result in an ideal absolute value of 500 uS, whereas a data bit duration encoded as a logic 1 will result in an ideal the absolute value of 0 uS. However, it will be apparent to a person skilled in the art that if the method 1800 was performed on the coded binary signal 1700, a data bit duration encoded as a logic 1 will result in an ideal absolute value of 500 uS, and a data bit duration encoded as a logic 0 will result in an ideal the absolute value of 0 uS.

After either of blocks 1855, 1860 have determined the logic value of a data bit, the high level or first accumulator A1, low level or second accumulator A2, accumulator reference timer ART and current edge timer (CET) are reset at a rest block 1865. The method 1800 then terminates at the end block 1870.

In summary, the method 1800 provides for the selectively updating one of the two accumulators A1, A2 by detecting the initial transition (or ending transition of last data bit) and then further transitions of a current data bit. The transition type for each of the further transitions is identified to thereby determine when the current data bit duration is at the first logic value or the second logic value and the time at each value is accumulated in the accumulators A1, A2. The accumulator values are then compared to identify the logic value of a data bit. When an erroneous transition occurs (due to electromagnetic interference in the coded binary signal 1600) this can be identified at block 1815, the method 1800 terminates and all counters and accumulators are then reset.

Advantageously, in some embodiments the present invention may provide for demodulating BASK modulated signals that have varying maximum ASK modulated signal values for logic 1 and 0. Also, in some embodiments the present invention may also be useful in alleviating erroneous decoding of glitches caused by electromagnetic interference.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A Binary Amplitude Shift Keying (BASK) demodulator for providing a binary demodulated signal of a BASK modulated signal having a variable frequency carrier signal that is variable between a minimum and a maximum carrier frequency, the BASK demodulator comprising:
   a signal modifying circuit having input terminals and a signal modifying circuit output, wherein the signal modifying circuit includes,
      a signal scaling circuit that scales the BASK modulated signal received at the input terminals to provide an unclipped scaled and biased alternating signal that alternates about a bias voltage at a signal frequency of at least the minimum carrier frequency,
      a rectifying circuit connected to the scaling circuit that rectifies the unclipped scaled and biased alternating signal to provide a partially rectified signal, and
      an AC coupling circuit connected to the rectifying circuit that decouples the partially rectified signal to provide a clipped scaled and biased alternating signal;
   a low pass filter coupled to the signal modifying circuit for removing the signal frequency from the clipped scaled and biased alternating signal to provide a demodulated signal;
   an amplifier circuit coupled to the low pass filter to amplify the demodulated signal; and a signal shaping circuit coupled to the amplifier circuit for shaping the amplified demodulated signal and providing a shaped demodulated signal to an output of the demodulator to thereby provide the binary demodulated signal at the output of the demodulator.

2. The BASK demodulator of claim 1, wherein the signal modifying circuit includes at least one attenuator.

3. The BASK demodulator of claim 2, wherein the signal modifying circuit includes an operational amplifier and in operation a reference input of the operational amplifier is set to the bias voltage and coupled to one of the input terminals.

4. The BASK demodulator of claim 3, wherein the reference input of the operational amplifier is coupled to said one of the input terminals by the attenuator.

5. The BASK demodulator of claim 4, wherein the bias voltage is half that of a supply voltage of the demodulator.

6. The BASK demodulator of claim 5, wherein all input terminals of the operational amplifier are coupled to the input terminals by attenuators.

7. The BASK demodulator of claim 1, wherein the low pass filter has a cut off frequency no greater than 21 KHz.

8. The BASK demodulator of claim 7, wherein the amplifier circuit is configured as an integrator.

9. A method for demodulating a Binary Amplitude Key Shift Keying (BASK) modulated signal having a variable frequency carrier signal that is variable between a minimum and a maximum carrier frequency, the method being performed by a demodulator, wherein the method comprises:
   scaling the BASK modulated signal to provide an unclipped scaled and biased BASK modulated signal that alternates about a bias voltage at a signal frequency of at least the minimum carrier frequency;
   partially rectifying the unclipped scaled and biased BASK modulated signal to provide a partially rectified signal;
   AC coupling the partially rectified signal to provide a clipped scaled and biased alternating signal that alternates about a bias voltage at a signal frequency of at least the minimum carrier frequency;
   low pass filtering the clipped scaled and biased alternating signal to remove the signal frequency therefrom and provide a demodulated signal;
   amplifying the demodulated signal to provide an amplified demodulated signal; and
   shaping the amplified demodulated signal to provide the binary demodulated signal.

10. The method of claim 9, wherein the amplifying is performed by an integrating amplifier.

11. The method of claim 10, wherein the scaling includes attenuating the Binary Amplitude Shift Keying modulated signal.

12. The method of claim 10, wherein the bias voltage is half that of a supply voltage of the demodulator.

13. The method of claim 10, wherein the low pass filtering is characterised by using a filter that has a cut off frequency no greater than 21 KHz.

14. A method for decoding logic values of encoded sequential data bits forming at least part of a coded binary signal, the coded binary signal comprising pre-defined individual data bit durations bounded by binary logic state transitions, wherein the individual data bit durations that have a continuous binary logic state are encoded as a first logic value and the individual data bit durations that have more than one binary logic state are encoded as a second logic value, wherein the method is performed by a processor and the method includes:
   detecting an initial transition (or last transition) thereby indicating commencement a current data bit duration (or end a last data bit duration);
   selectively updating one of two accumulators, the accumulators being a first accumulator and a second accumulator, wherein the first accumulator tracks the time of the current data bit duration when at the first logic value and the second accumulator tracks the time of the current data bit duration when at the second logic value;
   identifying an end of current data bit duration transition thereby indicating completion of the current data bit duration;
   comparing a value stored in the first accumulator with a value stored in the second accumulator to provide a difference value; and
   determining the logic value of the current data bit duration based on the difference value.

15. The method of claim 14, wherein the difference value is an absolute value obtained from subtracting the values stored in the first and second accumulators.

16. The method of claim 15, wherein when the absolute value is greater than a threshold value the logic value is determined to be the first logic value.

17. The method of claim 16, wherein when the absolute value is less than the threshold value the logic value is determined to be the second logic value.

18. The method of claim 17, wherein the first logic value is a logic 0 and the second logic value is a logic 1.

19. The method of claim 17, wherein the selectively updating includes:
   detecting further transitions; and
   identifying a transition type of each of the further transitions to thereby determine when the current data bit duration is at the first logic value or the second logic value.

20. The method of claim 17, wherein the identifying an end of current data bit duration transition includes comparing the time duration between the initial transition and a further transition to determine if a threshold period has been reached.

* * * * *